US011329254B2

United States Patent
Wang

(10) Patent No.: US 11,329,254 B2
(45) Date of Patent: May 10, 2022

(54) DISPLAY PANEL AND DISPLAY DEVICE

(71) Applicant: Wuhan China Star Optoelectronics Semiconductor Display Technology Co., Ltd., Wuhan (CN)

(72) Inventor: Kun Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 224 days.

(21) Appl. No.: 16/638,466

(22) PCT Filed: Dec. 9, 2019

(86) PCT No.: PCT/CN2019/123920
§ 371 (c)(1),
(2) Date: Feb. 12, 2020

(87) PCT Pub. No.: WO2021/036088
PCT Pub. Date: Mar. 4, 2021

(65) Prior Publication Data
US 2021/0384464 A1    Dec. 9, 2021

(30) Foreign Application Priority Data

Aug. 28, 2019   (CN) .......................... 201910800322.0

(51) Int. Cl.
*H01L 51/52*    (2006.01)
*H01L 27/32*    (2006.01)

(52) U.S. Cl.
CPC ........ *H01L 51/5253* (2013.01); *H01L 27/323* (2013.01); *H01L 27/3276* (2013.01)

(58) Field of Classification Search
CPC  H01L 51/5253; H01L 27/323; H01L 27/3276
See application file for complete search history.

(56) References Cited

U.S. PATENT DOCUMENTS

| | | | |
|---|---|---|---|
| 2016/0147325 | A1 | 5/2016 | Tai et al. |
| 2018/0138450 | A1* | 5/2018 | Park .................... H01L 27/3246 |
| 2018/0226454 | A1* | 8/2018 | Liu ........................ H01L 27/323 |
| 2018/0233541 | A1 | 8/2018 | Zeng et al. |
| 2019/0067629 | A1 | 2/2019 | Wu |
| 2019/0103443 | A1 | 4/2019 | Kim et al. |

FOREIGN PATENT DOCUMENTS

| | | |
|---|---|---|
| CN | 104635981 | 5/2015 |
| CN | 106873839 | 6/2017 |
| CN | 107565066 | 1/2018 |

* cited by examiner

*Primary Examiner* — Kyoung Lee

(57) ABSTRACT

A display panel and a display device are provided and have a base substrate, a blocking wall, an encapsulation layer, and a touch capacitor layer. By forming a second-layer blocking wall and a first-layer blocking wall to form a second blocking wall, a height of the second blocking wall is increased. Further, a blocking block is disposed between the second blocking wall and the first blocking wall, thereby increasing a thickness and a height of the blocking wall. When inkjet printing an organic layer, a slope at edges of a display area is relatively smooth, which can make an entire encapsulation layer relatively flat, thereby reducing a height difference of wirings at the edges and avoiding a problem of inaccurate exposure and focus.

10 Claims, 2 Drawing Sheets

DISPLAY PANEL AND DISPLAY DEVICE

RELATED APPLICATIONS

This application is a National Phase of PCT Patent Application No. PCT/CN2019/123920 having International filing date of Dec. 9, 2019, which claims the benefit of priority of Chinese Patent Application No. 201910800332.0 filed on Aug. 28, 2019. The contents of the above applications are all incorporated by reference as if fully set forth herein in their entirety.

FIELD AND BACKGROUND OF THE INVENTION

The present disclosure relates to a technical field of touch display, and more particularly to a display panel and a display device.

Organic light emitting diode (OLED) devices have advantages of simple structure, fast response speed, active light emission, and low power consumption. They have been widely used in display fields such as mobile phones, tablets, and televisions. Screen touch technology has also undergone iterative development. At present, external touch units are generally used, but in order to reduce an overall thickness of the display panel, major manufacturers have taken the lead in using integrated touch units, which the touch circuit is made directly on an encapsulation film layer. Thin film encapsulation is widely used because it is suitable for a development direction of OLED encapsulation.

At present, in the thin-film encapsulation of display panels, encapsulation methods in which organic and inorganic layers are stacked are often used. The inorganic layer is responsible for blocking the invasion of water and oxygen, and the organic layer makes the interface flat and relieves stress. At present, a common manufacturing method of organic layers is inkjet printing. Liquid organic matter is printed on the panel, then cured by ultraviolet light, and then other inorganic layers are fabricated. In order to prevent liquid organic matter from overflowing during the printing process, major manufacturers have proposed to provide a blocking wall structure on an external side of a screen display area, so as to prevent the overflow of organic matter. However, thickness at the edges of organics tends to become relatively thin.

As shown in FIG. 1, in a design of an integrated touch unit (direct on-cell touch; DOT), in order to avoid complicated topography at the blocking wall 11, the wiring 12 is generally routed between an edge of the display area and the blocking wall. However, due to a slope of the organic layer 13 produced by inkjet printing at the edges, DOT edge wirings have a problem of being out of focus during exposure and development. As a result, the exposure of wiring 12 is not complete, and there is a risk of short circuit.

Therefore, there is an urgent need to provide a new display panel to reduce a height difference of the slope of the encapsulation layer on the edge of the display panel, thereby solving the problem of inaccurate focus of the edge wirings during exposure and development.

SUMMARY OF THE INVENTION

An object of the present disclosure is to provide a display panel and a display device. By increasing a thickness and a height of the blocking wall, when inkjet printing an organic layer, a slope at edges of a display area is relatively smooth, which can make an entire encapsulation layer relatively flat, thereby reducing a height difference of wirings at the edges and avoiding a problem of inaccurate exposure and focus.

The present disclosure provides a display panel having a display area and a peripheral area surrounding the display area. The display panel comprises: a base substrate; a blocking wall disposed on the base substrate and surrounding the display area; an encapsulation layer disposed on the base substrate and surrounded by the blocking wall; and a touch capacitor layer having a plurality of first metal wirings and disposed on a side of the encapsulation layer away from the base substrate, wherein the blocking wall includes a first blocking wall and a second blocking wall, the first blocking wall is adjacent to the display area, a gap is between the first blocking wall and the second blocking wall, and a blocking block is provided at the gap.

Further, a height of the second blocking wall is greater than a height of the first blocking wall; and/or the height of the second blocking wall is equal to the height of the first blocking wall.

Further, the second blocking wall comprises: a first-layer blocking wall; and a second-layer blocking wall disposed on the first-layer blocking wall.

Further, a structure of the first blocking wall is the same with a structure of the second blocking wall.

Further, the first blocking wall only has the second-layer blocking wall.

Further, the encapsulation layer comprises: a first encapsulation layer disposed on the base substrate, the first blocking wall, and the second blocking wall; an organic layer disposed on the first encapsulation layer of the display area and surrounded by the blocking block; and a second encapsulation layer disposed on the organic layer and the blocking wall.

Further, a height of the first blocking wall ranges from 1 to 2 um; and a height of the second blocking wall ranges from 2 to 4 um.

Further, a height of the blocking block is greater than or equal to a height of the second blocking wall.

Further, the touch capacitor layer comprises: a first metal layer disposed on the encapsulation layer, wherein the plurality of first metal wirings are disposed in the first metal layer; an insulating layer disposed on the first metal layer and the encapsulation layer; and a second metal layer disposed on the insulating layer and having a plurality of second metal wirings, wherein the second metal wirings are staggered with the first metal wirings.

The present disclosure further provides a display device including the display panel described above.

The present disclosure provides a display panel and a display device. By forming a second-layer blocking wall and a first-layer blocking wall to form a second blocking wall, a height of the second blocking wall is increased. Further, a blocking block is disposed between the second blocking wall and the first blocking wall, thereby increasing a thickness and a height of the blocking wall. When inkjet printing an organic layer, a slope at edges of a display area is relatively smooth, which can make an entire encapsulation layer relatively flat, thereby reducing a height difference of wirings at the edges and avoiding a problem of inaccurate exposure and focus. At the same time, a structure of the first blocking wall can be set to be the same as that of the second blocking wall, and a height of the blocking block is increased. This further increases a height of the entire blocking wall, so that a fabricated encapsulation layer is relatively flat.

BRIEF DESCRIPTION OF THE SEVERAL VIEW OF THE DRAWINGS

In order to more clearly describe technical solutions in embodiments of the present disclosure, drawings required to be used for the embodiments are simply described hereinafter. Apparently, the drawings described below only illustrate some embodiments of the present disclosure. Those skilled in the art can obtain other drawings based on these drawings disclosed herein without creative effort.

Figure 1:
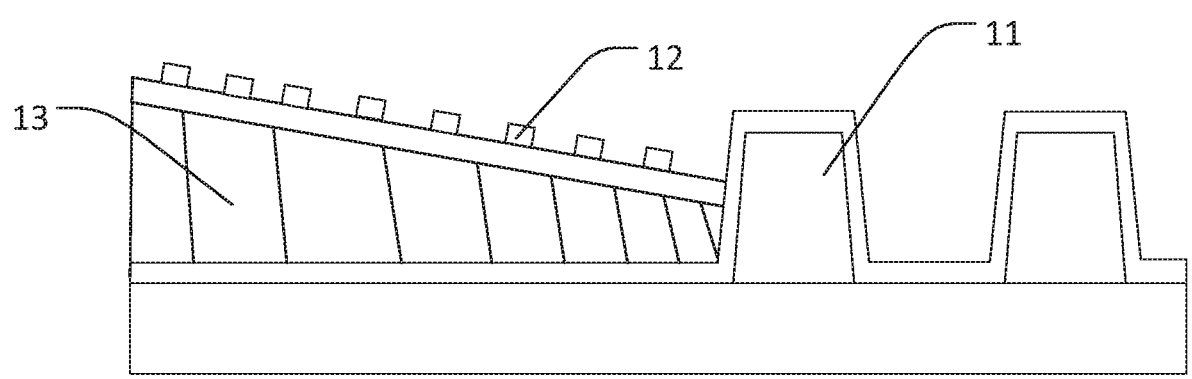
FIG. 1 is a schematic structural diagram of a conventional display panel.

display panel 100, 100b;
display area 110; peripheral area 120; blocking wall 130;
base substrate 101; encapsulation layer 102, 102b; touch capacitor layer 103;
first blocking wall 1301, 1301b; second blocking wall 1302, 1302b;
first-layer blocking wall 1302a; second-layer blocking wall 1304a; first encapsulation layer 1021;
organic layer 1022, 1022b; second encapsulation layer 1023; blocking block 1303;
first metal layer 1031; insulating layer 1032; second metal layer 1033;
first metal wiring 1031a; second metal wiring 1033a

DESCRIPTION OF SPECIFIC EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc. are only directions by referring to the accompanying drawings. Names of elements mentioned in the present disclosure, such as first, second, etc., are only used to distinguish different components which can be better expressed. In figures, elements with similar structures are indicated with the same numbers.

Embodiments of the present disclosure will be described in detail herein with reference to the drawings. The disclosure may take many different forms, and the disclosure should not be construed as merely the specific embodiments set forth herein. The embodiments of the present disclosure are provided to explain a practical application of the present disclosure, so that those skilled in the art can understand various embodiments of the present disclosure and various modifications suitable for a specific intended application.

Figure 2:
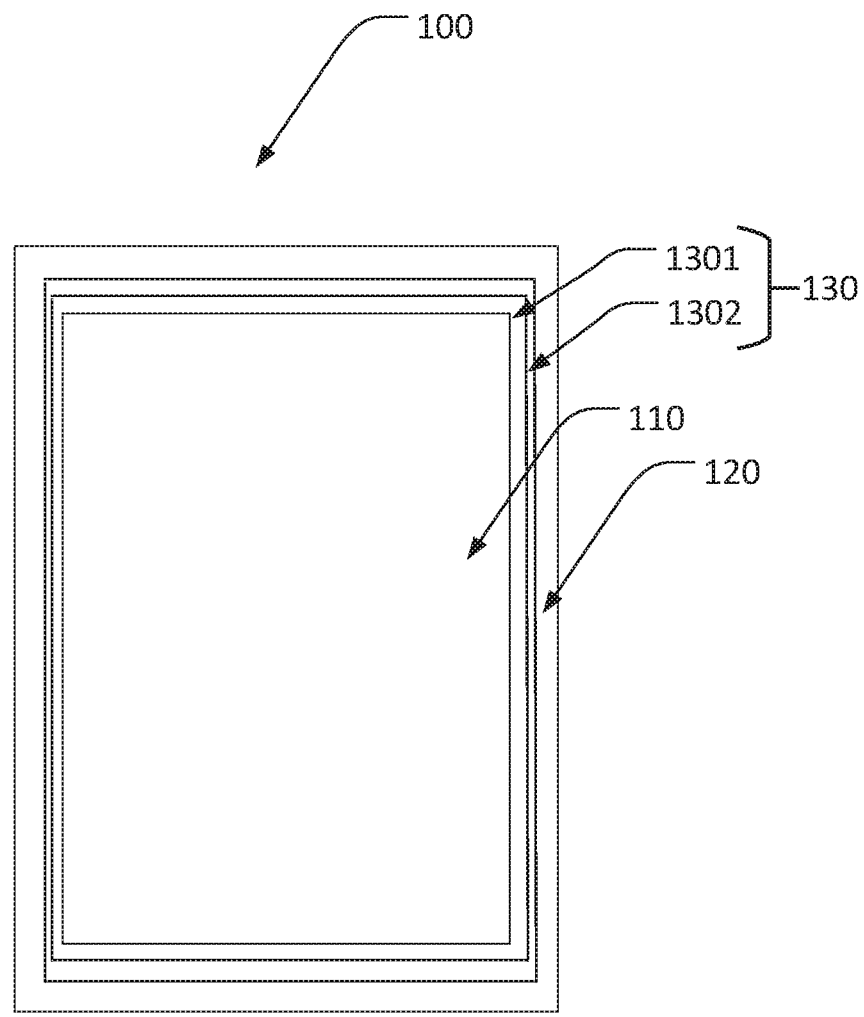
FIG. 2 is a plan view of a display panel according to an embodiment of the present disclosure.
Figure 3:
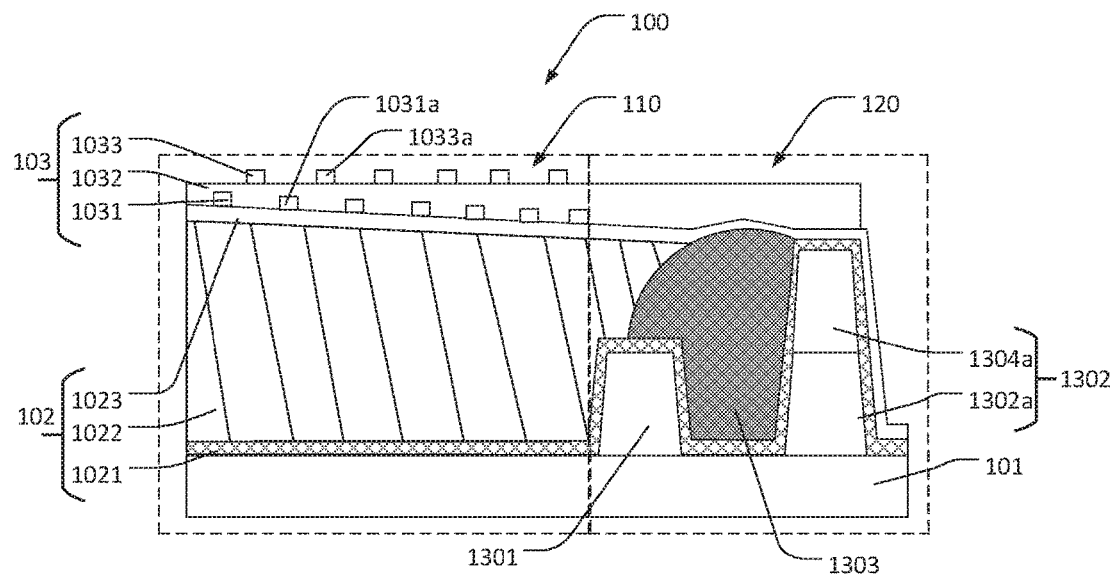
FIG. 3 is a schematic structural diagram of a display panel according to an embodiment of the present disclosure.

Please refer to FIG. 2 and FIG. 3 at the same time. An embodiment of the present disclosure provides a display panel 100 having a display area 110 and a peripheral area 120. The peripheral area 120 surrounds the display area 110.

The display panel 100 comprises: a base substrate 101, a blocking wall 130, an encapsulation layer 102, and a touch capacitor layer 103.

The base substrate 101 comprises an array substrate, an anode, an organic light-emitting layer, a cathode, a light-coupling output layer, and a lithium fluoride layer The anode is disposed on the array substrate. The organic light-emitting layer is disposed on a side of the anode away from the array substrate. The cathode is disposed on a side of the organic light-emitting layer away from the anode. The light-coupling output layer is disposed on a side of the cathode away from the organic light-emitting layer. The lithium fluoride layer is disposed on a side of the light-coupling output layer away from the cathode.

The base substrate 101 is a conventional technology, so the array substrate, the anode, the organic light-emitting layer, the cathode, the light-coupling output layer, and the lithium fluoride layer are not shown and marked in the drawings.

The encapsulation layer 102 is disposed on the base substrate 101 and is surrounded by the blocking wall 130. The blocking wall 130 is disposed on the base substrate 101 and surrounds the display area 110, and the blocking wall 130 mainly plays a role of blocking a flow of the encapsulation layer 102.

The touch capacitor layer 103 has a plurality of first metal wirings 1031a and is disposed on a side of the encapsulation layer 102 away from the base substrate 101.

The blocking wall 130 is disposed in the peripheral area 120. A height of the blocking wall 130 is the same as a height of the encapsulation layer 102. Furthermore, at a position of the display area 110 adjacent to the blocking wall 130, the height of the blocking wall 130 is increased, and a slope of the thin film encapsulation layer 102 during inkjet printing is reduced. Therefore, when the first metal wirings 1031a are deposited, a height difference is reduced to avoid a problem of inaccurate exposure focus on the first metal wirings 1031a.

In an embodiment, the blocking wall 130 includes a first blocking wall 1301 and a second blocking wall 1302. The first blocking wall 1301 is adjacent to the display area 110. A gap is between the first blocking wall 1301 and the second blocking wall 1302. A blocking block 1303 is provided at the gap.

Material of the blocking block 1303 is photoresist polyimide. A height of the blocking block 1303 is the same as a height of the second blocking wall 1302.

The blocking block 1303 is formed by first placing an organic substance at the gap, and then forming the blocking block 1303 by curing.

The height of the second blocking wall 1302 is greater than a height of the first blocking wall 1301. The height of the first blocking wall 1301 ranges from 1 to 2 um, and the height of the second blocking wall 1302 ranges from 2 to 4 um.

The second blocking wall 1302 comprises: a first-layer blocking wall 1302a and a second-layer blocking wall 1304a. Material of the first-layer blocking wall 1302a includes polyimide, and material of the second-layer blocking wall 1304a includes polyimide.

In this embodiment, the second-layer blocking wall 1304a is disposed on the first-layer blocking wall 1302a. The first blocking wall 1301 has only the second-layer blocking wall 1304a, such that the height of the second blocking wall 1302 is greater than the height of the first blocking wall 1301.

The encapsulation layer 102 comprises a first encapsulation layer 1021, an organic layer 1022, and a second encapsulation layer 1023.

The first encapsulation layer 1021 is disposed on the base substrate 101, the first blocking wall 1301, and the second blocking wall 1302. The organic layer is disposed on the first encapsulation layer 1021 of the display area 110 and surrounded by the blocking block 1303. The second encapsulation layer 1023 is disposed on the organic layer 1022 and the blocking wall 130.

In an embodiment, the blocking block 1303 is disposed at the gap. Further, the height of the blocking block 1303 and the second blocking wall 1302 are increased to ensure a thickness of the edge when printing the organic layer 1022, so as to reduce the slope at the edge. Therefore, a height difference of wirings at the edges is reduced to avoid the problem of inaccurate exposure and focus.

The touch capacitor layer 103 comprises a first metal layer 1031, an insulating layer 1032, and a second metal layer 1033.

The first metal layer 1031 is disposed on the encapsulation layer 102, wherein the plurality of first metal wirings 1031a are disposed in the first metal layer 1031. The insulating layer 1032 is disposed on the first metal layer 1031 and the encapsulation layer 102.

The second metal layer 1033 is disposed on the insulating layer 1032 and have a plurality of second metal wirings 1033a. The second metal wirings 1033a are staggered with the first metal wirings 1031a.

Figure 4:
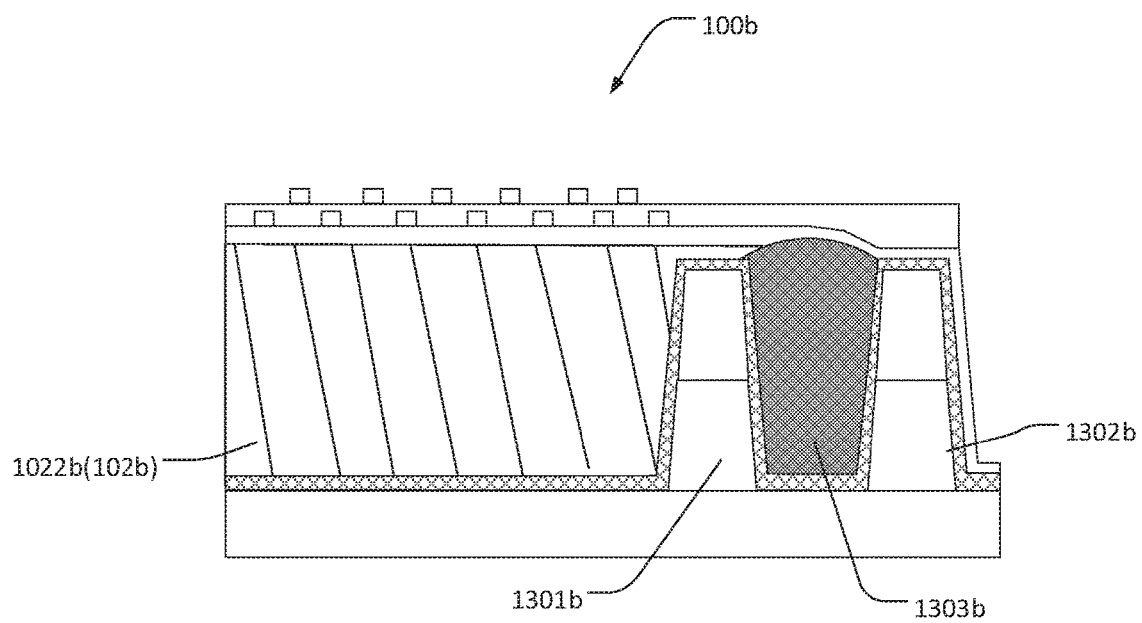
FIG. 4 is a schematic structural diagram of a display panel according to another embodiment of the present disclosure.

As shown in FIG. 4, the present disclosure provides a display panel 100b according to another embodiment. A difference between the display panel 100b and the display panel 100 in the foregoing embodiment is that: a structure of a first blocking wall 1301b is the same with a structure of a second blocking wall 1302b. The first blocking wall 1301b also has a two-layer structure, and a height of the first blocking wall 1301b is the same with a height of the second blocking wall 1302b.

In another embodiment, a blocking block 1303b can be formed by filling so as to form a higher height than a height of the first blocking wall 1301b and the second blocking wall 1302b on both sides. Therefore, the height of the blocking wall is increased. When inkjet printing, an effect of blocking the printing of the organic layer 1022b can be relatively good, so that the organic layer 1022b can be flattened. Therefore, the encapsulation layer 102b is flat at the edges, thereby reducing a height difference of wirings at the edges and avoiding a problem of inaccurate exposure and focus.

The present disclosure further provides a display device. The display device comprises a display panel 100. By forming a second-layer blocking wall 1304a and a first-layer blocking wall 1302 to form a second blocking wall 1302, a height of the second blocking wall 1302 is increased. Further, a blocking block 1303 is disposed between the second blocking wall 1302 and the first blocking wall 1301, thereby increasing a thickness and a height of the blocking wall 130. When inkjet printing an organic layer 1022, a slope at edges of a display area 110 is relatively smooth, which can make an entire encapsulation layer 102 relatively flat, thereby reducing a height difference of wirings at the edges and avoiding a problem of inaccurate exposure and focus. At the same time, a structure of the first blocking wall 1301 can be set to be the same as that of the second blocking wall 1302, and a height of the blocking block 1303 is increased. This further increases a height of the entire blocking wall 130, so that a fabricated encapsulation layer 102 is relatively flat.

Technical scopes of the present disclosure are not limited to a content in the description. Those skilled in the art can make various variations and modifications to the embodiment without departing from a technical idea of the present disclosure, and these variations and modifications should all fall within the scope of the present disclosure.

What is claimed is:

1. A display panel, having a display area and a peripheral area surrounding the display area, and the display panel comprising:
a base substrate;
a blocking wall disposed on the base substrate and surrounding the display area;
an encapsulation layer disposed on the base substrate and surrounded by the blocking wall; and
a touch capacitor layer having a plurality of first metal wirings and disposed on a side of the encapsulation layer away from the base substrate,
wherein the blocking wall includes a first blocking wall and a second blocking wall,
the first blocking wall is adjacent to the display area, a gap is between the first blocking wall and the second blocking wall, and a blocking block is provided at the gap,
wherein the second blocking wall comprises:
a first-layer blocking wall; and
a second-layer blocking wall disposed on the first-layer blocking wall; and
wherein the first blocking wall only has the second-layer blocking wall.

2. The display panel according to claim 1, wherein:
a height of the second blocking wall is greater than a height of the first blocking wall.

3. The display panel according to claim 1, wherein:
the encapsulation layer comprises:
a first encapsulation layer disposed on the base substrate, the first blocking wall, and the second blocking wall;
an organic layer disposed on the first encapsulation layer of the display area and surrounded by the blocking block; and
a second encapsulation layer disposed on the organic layer and the blocking wall.

4. The display panel according to claim 1, wherein:
a height of the first blocking wall ranges from 1 to 2 um; and
a height of the second blocking wall ranges from 2 to 4 um.

5. The display panel according to claim 1, wherein:
a height of the blocking block is greater than or equal to a height of the second blocking wall.

6. The display panel according to claim 1, wherein:
the touch capacitor layer comprises:
a first metal layer disposed on the encapsulation layer, wherein the plurality of first metal wirings are disposed in the first metal layer;
an insulating layer disposed on the first metal layer and the encapsulation layer; and
a second metal layer disposed on the insulating layer and having a plurality of second metal wirings,
wherein the second metal wirings are staggered with the first metal wirings.

7. A display device, comprising: a display panel having: a display area and a peripheral area surrounding the display area, and the display panel comprising:
a base substrate;
a blocking wall disposed on the base substrate and surrounding the display area;
an encapsulation layer disposed on the base substrate and surrounded by the blocking wall; and
a touch capacitor layer having a plurality of first metal wirings and disposed on a side of the encapsulation layer away from the base substrate,
wherein the blocking wall includes a first blocking wall and a second blocking wall, the first blocking wall is adjacent to the display area, a gap is between the first blocking wall and the second blocking wall, and a blocking block is provided at the gap,
wherein the second blocking wall comprises:
a first-layer blocking wall; and
a second-layer blocking wall disposed on the first-layer blocking wall; and
wherein the first blocking wall only has the second-layer blocking wall.

8. The display device according to claim 7, wherein:
a height of the second blocking wall is greater than a height of the first blocking wall.

9. The display device according to claim 7, wherein:
a height of the first blocking wall ranges from 1 to 2 um; and
a height of the second blocking wall ranges from 2 to 4 um.

10. The display device according to claim 7, wherein:
a height of the blocking block is greater than or equal to a height of the second blocking wall.

\* \* \* \* \*

UNITED STATES PATENT AND TRADEMARK OFFICE
CERTIFICATE OF CORRECTION

| | | |
|---|---|---|
| PATENT NO. | : 11,329,254 B2 | Page 1 of 1 |
| APPLICATION NO. | : 16/638466 | |
| DATED | : May 10, 2022 | |
| INVENTOR(S) | : Kun Wang | |

It is certified that error appears in the above-identified patent and that said Letters Patent is hereby corrected as shown below:

On the Title Page

In item (30) Foreign Application Priority Data:
"201910800322.0"
Should be changed to:
-- 201910800332.0 --

Signed and Sealed this
Eleventh Day of April, 2023

Katherine Kelly Vidal
*Director of the United States Patent and Trademark Office*